(12) United States Patent
Takaguchi et al.

(10) Patent No.: US 6,915,941 B2
(45) Date of Patent: Jul. 12, 2005

(54) METHOD FOR LOCAL APPLICATION OF SOLDER TO PRESELECTED AREAS ON A PRINTED CIRCUIT BOARD

(75) Inventors: Akira Takaguchi, Toyama (JP); Masaki Wata, Tokyo (JP); Chikara Numata, Tokyo (JP)

(73) Assignees: Senju Metal Industry Co., Ltd., Tokyo (JP); KTT Co., Ltd., Toyama-ken (JP)

( * ) Notice: Subject to any disclaimer, the term of this patent is extended or adjusted under 35 U.S.C. 154(b) by 294 days.

(21) Appl. No.: 10/231,141

(22) Filed: Aug. 30, 2002

(65) Prior Publication Data

US 2003/0066866 A1 Apr. 10, 2003

(30) Foreign Application Priority Data

Aug. 31, 2001 (JP) .......................... 2001-263933

(51) Int. Cl.[7] .......................... B23K 31/02; B23K 35/12
(52) U.S. Cl. .................................... 228/180.1; 228/260
(58) Field of Search .................... 228/180.1, 180.21, 228/180.22, 244, 260

(56) References Cited

U.S. PATENT DOCUMENTS

| 3,482,755 | A | | 12/1969 | Raciti | |
|---|---|---|---|---|---|
| 3,834,015 | A | * | 9/1974 | Di Renzo | 29/843 |
| 3,921,888 | A | * | 11/1975 | Elliott et al. | 228/180.1 |
| 4,545,520 | A | * | 10/1985 | Kent | 228/180.1 |
| 4,616,775 | A | * | 10/1986 | Simonetti | 228/37 |
| 5,203,489 | A | * | 4/1993 | Gileta et al. | 228/219 |
| 5,209,782 | A | | 5/1993 | Morris | |
| 5,292,055 | A | * | 3/1994 | Gileta | 228/180.1 |
| 5,361,969 | A | * | 11/1994 | Gileta | 228/180.1 |
| 5,538,175 | A | * | 7/1996 | Massini et al. | 228/102 |
| 6,050,473 | A | * | 4/2000 | Masuda et al. | 228/37 |
| 6,364,195 | B1 | * | 4/2002 | Masuda et al. | 228/37 |
| 2001/0032869 | A1 | | 10/2001 | Ichikawa et al. | |

FOREIGN PATENT DOCUMENTS

| EP | 0 269 822 | | 6/1988 |
|---|---|---|---|
| JP | 49-70849 | * | 7/1974 |
| JP | 2-112876 | * | 4/1990 |
| JP | 8-267227 | * | 10/1996 |
| JP | 11-123541 | * | 5/1999 |
| JP | 2000-52031 | * | 2/2000 |

* cited by examiner

*Primary Examiner*—Stanley S. Silverman
*Assistant Examiner*—Colleen P. Cooke
(74) *Attorney, Agent, or Firm*—Wenderoth, Lind & Ponack, L.L.P.

(57) ABSTRACT

A method for locally applying solder to a set of preselected conductor areas on a printed circuit board without causing thermal damage to adjacent sensitive surface mounted devices and connectors. Before solder is applied, molten solder within a solder reservoir is pumped upwardly through a set of solder wave nozzles so as to clean and preheat the nozzles. The preselected conductor areas on the board are then aligned with the nozzles. At this time, the board is maintained at a height slightly above the nozzles to the extent that the molten solder is prevented from escaping from between the board and the nozzles. A relatively low wave of solder is produced through the nozzles to cause the low wave of solder to contact and preheat the preselected conductor areas on the board. A relatively high wave of solder is then produced through the nozzles to locally solder the preselected conductor areas on the printed circuit board.

5 Claims, 5 Drawing Sheets

FIG. 10
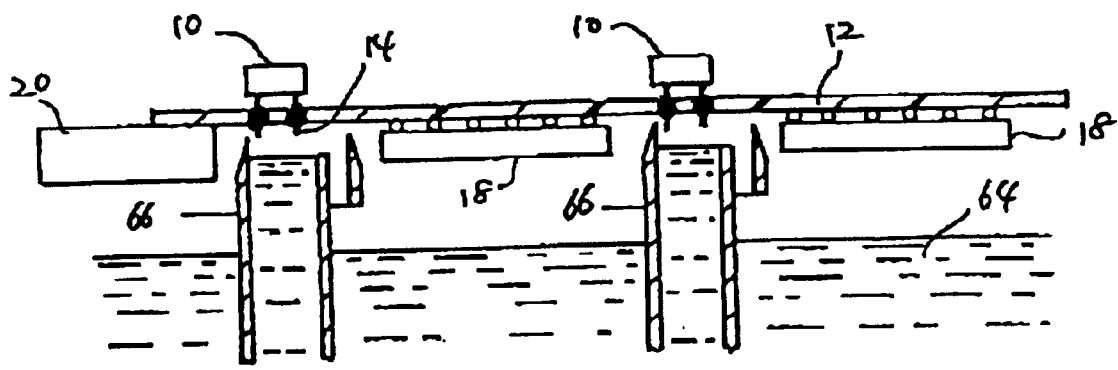
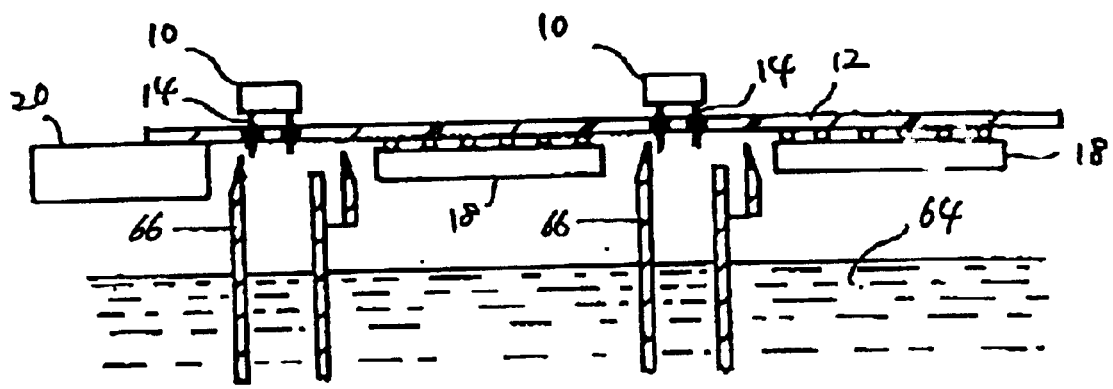
FIG. 11

METHOD FOR LOCAL APPLICATION OF SOLDER TO PRESELECTED AREAS ON A PRINTED CIRCUIT BOARD

BACKGROUND OF THE INVENTION

The present invention relates to a method for wave soldering printed circuit boards wherein a solder coating is applied only where needed.

A usual automatic wave soldering apparatus includes a pair of endless chain conveyors driven to advance a printed circuit board at a constant speed from the entrance to exit ends of the apparatus. With the printed circuit board held by gripping fingers, the board is first carried to a fluxer where a foam or spray of flux is applied to the underside of the board. The printed circuit board is then carried over preheaters where the temperature of each board is elevated to approximately 110° C. to 130° C. so as to evaporate excess flux solvent, activate the flux and minimize thermal shock to the printed circuit board. After the printed circuit board is brought to such a preheat temperature, the board is passed over a solder reservoir to receive solder. The board is finally transported to a cool down zone where the solder is cooled to solidify.

Typically, pin grid alley modules and dual in-line packages are loaded onto one side of a printed circuit board, with their terminals or leads projecting downwardly through apertures in the printed circuit board. To increase packaging density, a number of surface mounted devices and connectors are loaded onto the other, underside side of the printed circuit board. Problems have arisen from wave soldering such a printed circuit board. Too much heat occurs on the underside of the board, when contacted with a solder wave, and tends to damage the surface mounted devices.

Attempts have been made to locally apply solder to preselected conductor areas on a printed circuit board, but not to those areas where surface mounted devices and connectors are mounted. In one known method, flux is locally spayed onto preselected conductor areas on a printed circuit board. The fluxed board is then preheated by a stream of warm gas to evaporate flux solvent. Thereafter, the board is positioned over a plurality of solder wave nozzles arranged within a solder reservoir. At this time, the solder wave nozzles are brought into alignment with a plurality of sets of preselected areas on the printed circuit board. A pump is arranged within the solder reservoir to force heated molten solder to flow upwardly through the solder wave nozzles so as to form solder waves. The preselected areas on the printed circuit board are contacted with the respective solder waves to make soldered joints. The height of the solder waves is then lowered until it becomes equal to the surface level of the molten solder within the solder reservoir. The position of the board is maintained until the solder solidifies. Finally, the board is delivered to a cool down zone wherein the printed circuit board is cooled.

This known method has proven to be effective for eliminating heat damage to sensitive electronic components such as surface mounted devices, but the method suffers from certain disadvantages. One problem is the attachment of solder oxides, better known as dross, and carbonized flux to soldered joints on a printed circuit board. Part of the molten solder tends to remain on the inner wall of the solder wave nozzles when the molten solder is immediately returned to the solder reservoir. The solder, typically composed of tin and lead, has a tendency to oxidize in the atmosphere. The resulting oxides are detrimental to the quality of the soldered joints. Also, part of the flux which has previously been applied to the soldered joints could be attached to the inner wall of the solder wave nozzles. This flux is carbonized by the heat from the molten solder. The resulting carbide could be attached to the inner wall of the solder wave nozzles. The oxides and the carbide will be separated from the inner wall of the solder wave nozzles when the molten solder within the solder reservoir is pumped up through the solder wave nozzles to process a next printed circuit board. The oxides and the carbide could be attached to soldered joints formed on the next printed circuit board. Another problem is the formation of icicles, solder bridges and other imperfections in the solder. When the conductor areas on the board are not sufficiently preheated, the solder solidifies before the conductor areas are completely wetted. This results in faulty solder connections. Also, such imperfections occurs when the solder wave is detached from the printed circuit board too fast.

Accordingly, it is an object of the present invention to provide a method for locally applying solder to preselected conductor or solderable areas on a printed circuit board, which prevents the occurrence of icicles, bridges and other solder imperfections, and which can force solder into through holes and other hard-to-reach areas to be soldered.

SUMMARY OF THE INVENTION

According to the present invention, there is provided a method for locally applying solder to a set of preselected conductor areas on a printed circuit board, which comprises aligning the set of preselected conductor areas on the printed circuit board with a corresponding set of fluxers, applying flux locally to the preselected conductor areas on the printed circuit board, aligning the preselected conductor areas on the printed circuit board with a corresponding set of preheaters, drying the flux applied on the preselected conductor areas on the printed circuit board, forcing molten solder within a solder reservoir to flow upwardly through a set of solder wave nozzles so as to clean and preheat the solder wave nozzles, aligning the preselected conductor areas on the printed circuit board with the solder wave nozzles and maintaining the printed circuit board at a height slightly above the solder wave nozzles to the extent that the molten solder is prevented from escaping from between the printed circuit board and the solder wave nozzles, producing a relatively low wave of solder through the solder wave nozzles to cause the relatively low wave of solder to contact and preheat the preselected conductor areas on the printed circuit board, and producing a relatively high wave of solder through the solder wave nozzles to locally solder the preselected conductor areas on the printed circuit board.

Preferably, after the conductor areas on the printed circuit board are locally soldered, the molten solder within the solder wave nozzles may be lowered at a relatively slow speed, and the molten solder within the solder wave nozzles may be maintained at a height slightly below the top of the solder wave nozzles. Thereafter, the molten solder within the solder wave nozzles may be further lowered until the level of the molten solder within the solder wave nozzles is substantially equal to the level of the molten solder within the solder reservoir.

Preferably, the printed circuit board may be maintained at a height of 0.1 to 1.0 mm above the solder wave nozzles before the relatively low wave of solder is produced.

Preferably, after the solder wave nozzles are cleaned and preheated, the molten solder may be maintained within the solder wave nozzles at a height slightly below the top of the solder wave nozzles.

BRIEF DESCRIPTION OF THE DRAWINGS

The above and other objects, features and advantages of the present invention will become more apparent from a reading of the following description of preferred embodiments when taken in conjunction with the accompanying drawings, in which:

FIG. 10 is a schematic view of the solder wave nozzles wherein the level of the molten solder is lowered slightly below the top of the nozzles; and FIG. 11 is a schematic view of the solder wave nozzles wherein the level of the molten solder becomes equal to the level of the molten solder within the solder reservoir.

DETAILED DESCRIPTION OF THE INVENTION

Reference will now be made as to how solder is locally applied to a plurality of sets of preselected conductor areas on a printed circuit board.

Figure 1:
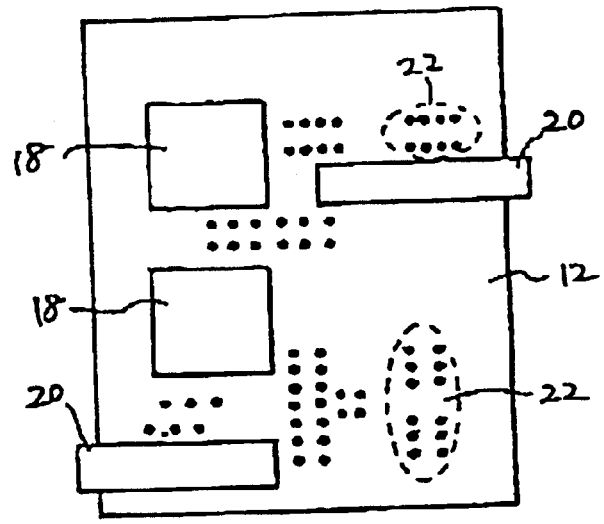
FIG. 1 is a bottom plan view of a printed circuit board to be processed by a method according to the present invention.
Figure 2:
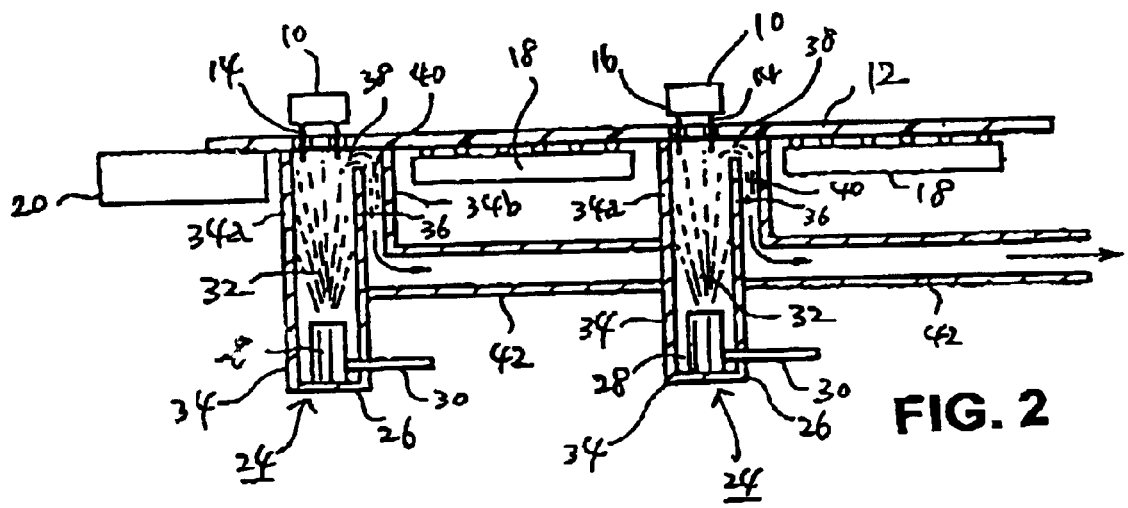
FIG. 2 is a schematic view of fluxers used to carry out the method of the present invention.

Referring to FIGS. 1 and 2, pin grid alley modules, dual in-line packages and other electronic components 10 are loaded onto the top side of a printed circuit board 12. Each of these electrical components 10 includes a set of terminals or leads 14 which project downwardly through apertures 16 formed in the printed circuit board 12. A plurality of surface mounted devices 18 and connectors 20 are loaded onto the underside of the printed circuit board 12. The printed circuit board 12 has a plurality of sets of terminal pads or other preselected conductor areas 22 to which the component leads 16 are joined by solder.

Referring again to FIG. 2, the printed circuit board 12 is first carried to a set of fluxers, as generally designated at 24, by a conveyor (not shown) so that the sets of preselected conductor areas 22 on the board 12 are precisely aligned with the respective fluxers 24. In the illustrated embodiment, each of the fluxers 24 includes a generally rectangular enclosure 26. A spray nozzle 28 is disposed at the bottom of the enclosure 26. The spray nozzle 28 is connected through a tube 30 to a common container (not shown) within which a supply of flux is held Although not shown, a pump is connected between the spray nozzle 28 and the container and activated to feed the flux from the container to the spray nozzle. The spray nozzle 28 is designed to atomize the flux to provide a flux spray 32 such that the conductor areas 22 on the printed circuit board 12 are wet without creating flux droplets. Each of the enclosures 26 is composed of a generally rectangular outer wall section 34 and a U-shaped inner wall section 36 disposed within the outer wall section 34. The outer wall section 34 has an upstream end wall 34a and a downstream end wall 34b connected to the upstream end wall 34a by opposite side walls (not shown). The downstream end wall 34b depends from the top of the outer wall section 34 and terminates midway between the top and bottom ends of the enclosure 26. The inner wall section 36 has a height less than that of the outer wall section 34. The inner wall section 36 includes an end wall 36a and opposite side walls (not shown) connected to opposite sides of the end wall 36a. With this arrangement, an opening 38 is defined between the inner wall section 36 and the printed circuit board 12 when the printed circuit board 12 is positioned on the enclosure 26. Also, a passageway 40 is defined between the end wall 36a of the inner wall section 36 and the downstream end wall 34b of the outer wall section 34. A duct 42 is connected to each enclosure 26 and communicated with the interior of the enclosure 26 through the opening 38 and the passageway 40. After the flux is sprayed onto the preselected conductor areas 22 on the board 12, the opening 38, the passageway 40 and the duct 42 cooperate to allow the escape of excess flux from the enclosure 26.

Figure 3:
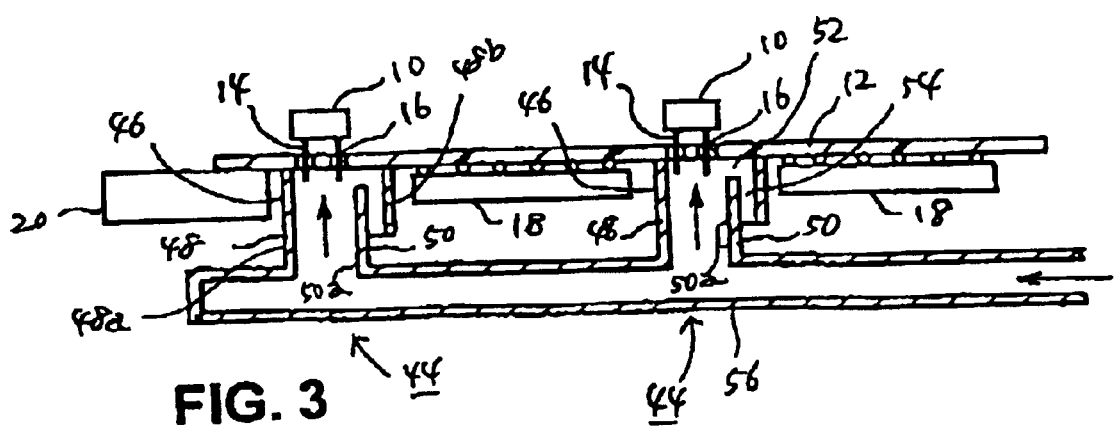
FIG. 3 is a schematic view of preheaters used to carry out the method of the present invention.

Referring to FIG. 3, after application of the fluxing coating, the printed circuit board 12 is carried to a set of preheaters, as generally designated at 44, such that the set of preselected conductor areas 22 on the board 12 are precisely aligned with the respective preheaters 44. Each of the preheaters 44 includes an enclosure 46 to avoid thermal damage to the adjacent surface mounted devices 18 and the connectors 20. The enclosure 46 is composed of a generally rectangular outer wall section 48 and a U-shaped inner wall section 50 disposed within the outer wall section 48. The outer wall section 48 of the enclosure 46 has an upstream end wall 48a and a downstream end wall 48b connected to the upstream end wall 48a by opposite side walls (not shown). The downstream end wall 48b depends from the top of the outer wall section 48 and terminates midway between the top and bottom ends of the enclosure 46. The inner wall section 50 has a height less than that of the outer wall section 48. The inner wall section 50 includes an end wall 50a and opposite side walls (not shown) connected to opposite sides of the end wall 50a. With this arrangement, an opening 52 is defined between the inner wall section 50 and the printed circuit board 12 when the printed circuit board 12 is positioned on the enclosure 46. Also, a passageway 54 is defined between the end wall 50a of the inner wall section 50 and the downstream end wall 48b of the outer wall section 48. A common duct 56 is connected to the open bottom of the enclosures 46 so as to feed a stream of warm gas to each preheater, as shown by the arrows in FIG. 3. The warm gas acts to elevate the temperature of the printed circuit board 12 to a temperature at which flux carrier solvent is driven off. The warm gas also allows the board 12 to thermally prepare to contact molten solder with low thermal stress. The warm gas is allowed to escape from each enclosure through the opening 52 and the passageway 54.

Figure 4:
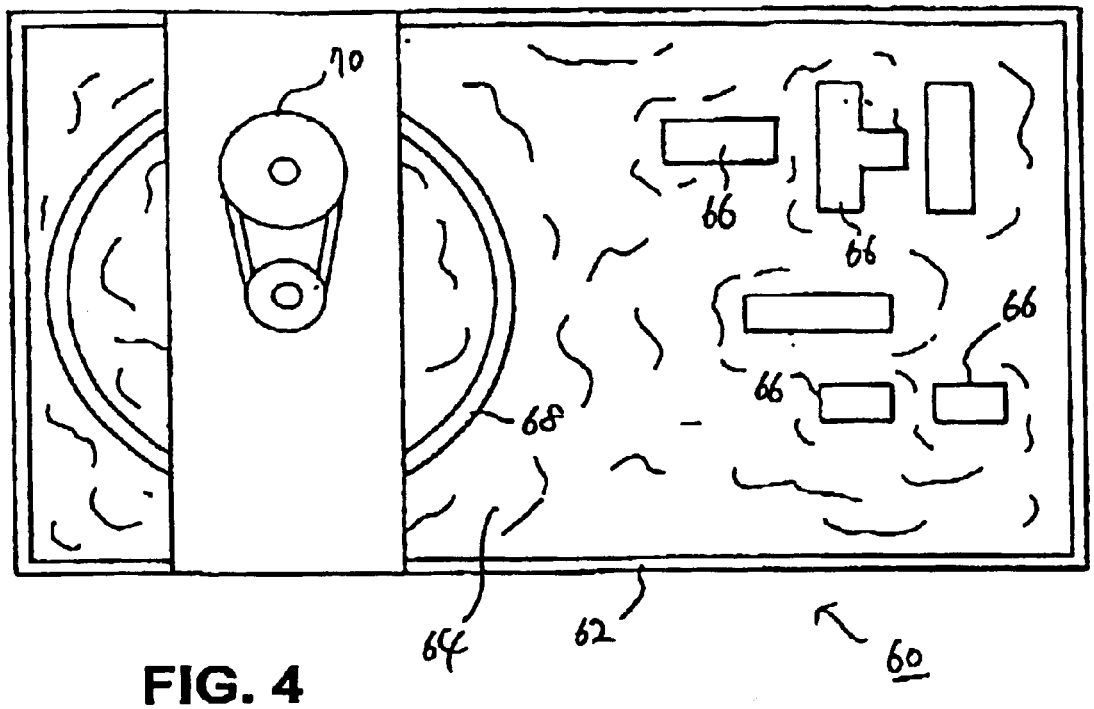
FIG. 4 is a top plan view of a wave soldering machine used to carry out the method of the present invention.

Referring next to FIG. 4, there is illustrated an automatic wave soldering machine generally designated at 60. The wave soldering machine 60 includes a rectangular solder reservoir 62 within which a supply of solder 64 is held. The solder reservoir 62 is provided with heaters (not shown) to maintain the solder 64 in a molten condition. The heaters may be secured to the bottom or side walls of the solder reservoir 62, or may be arranged outside of the solder reservoir 62. A set of solder wave nozzles 66 are arranged in the solder reservoir 62 and extend above the solder level. A pump 68 is immersed in the solder reservoir 62 and driven by a motor 70. The pump 68 is connected to the solder wave nozzles 66 and adapted to force the solder 64 to flow up through the solder wave nozzles 66 so as to form solder waves.

Figure 5:
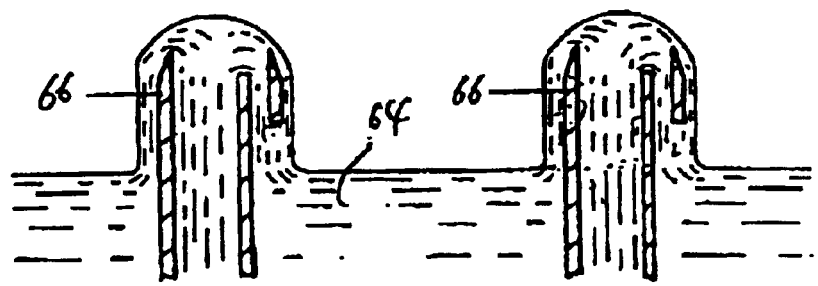
FIG. 5 is a schematic view of solder wave nozzles disposed in the wave soldering machine wherein molten solder is pumped up through the nozzles to clean and preheat the nozzles.

Referring to FIG. 5, the molten solder is forced up through the solder wave nozzles 66 for, for example, approximately 1 second so as to clean and preheat the solder wave nozzles 66 before the solder is applied to the preselected conductor areas 22 on the printed circuit board 12. This upward flow of the heated molten solder can effectively remove any tin and lead oxides which may be produced during a previous cycle of operation and left on the inner wall of the solder wave nozzles 66. Without this step, the temperature of the molten solder may be undesirably reduced when the molten solder is subsequently forced to flow upwardly through the nozzles 66. Such a reduction in temperature causes insufficient preheating of the preselected conductor areas 22 on the board 12 and thus, results in the formation of icicles, bridge and other imperfections. It is to be understood that this step may be carried out while the printed circuit board 12 is positioned above the solder wave nozzles 66.

Figure 6:
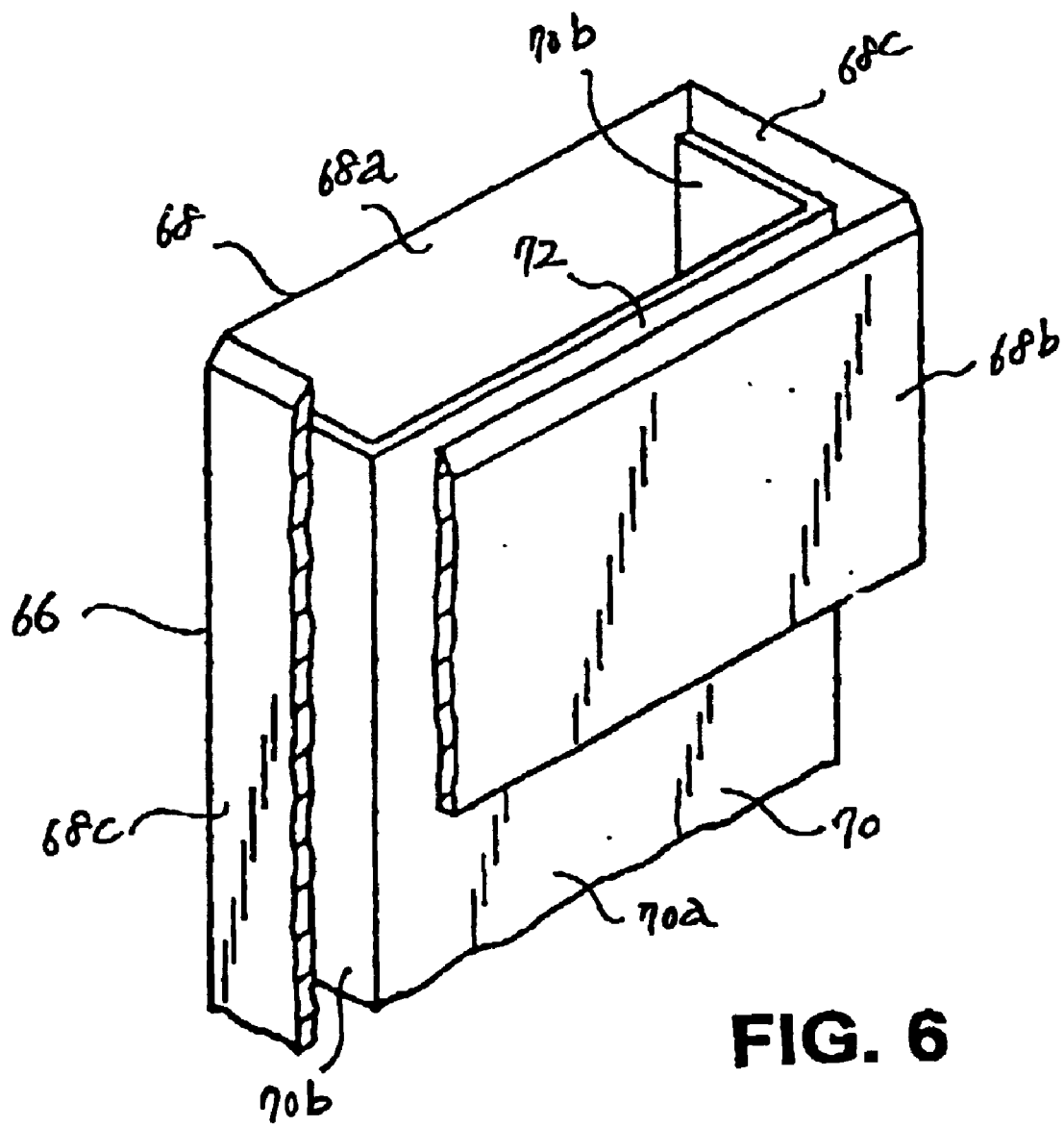
FIG. 6 is a partial perspective view, on an enlarged scale, of the solder wave nozzle shown in FIG. 5.

As shown in FIG. 6, each of the solder wave nozzles 66 is composed of a generally rectangular outer wall section 68 and a U-shaped inner wall section 70 disposed within the outer wall section 68. The outer wall section 68 of the nozzle 66 has an upstream end wall 68a and a downstream end wall 68b connected to the upstream end wall 68a by opposite side walls 68c. The downstream end wall 68b depends from the top of the outer wall section 68 and terminates midway between the top and bottom ends of the solder wave nozzle 66. The inner wall section 70 has a height less than that of the outer wall section 68. The inner wall section 70 includes an end wall 70a and opposite side walls 70b connected to opposite sides of the end wall 70a. With this arrangement, a passageway 72 is defined between the end wall 70a of the inner wall section 70 and the downstream end wall 68b of the outer wall section 68.

Figure 7:
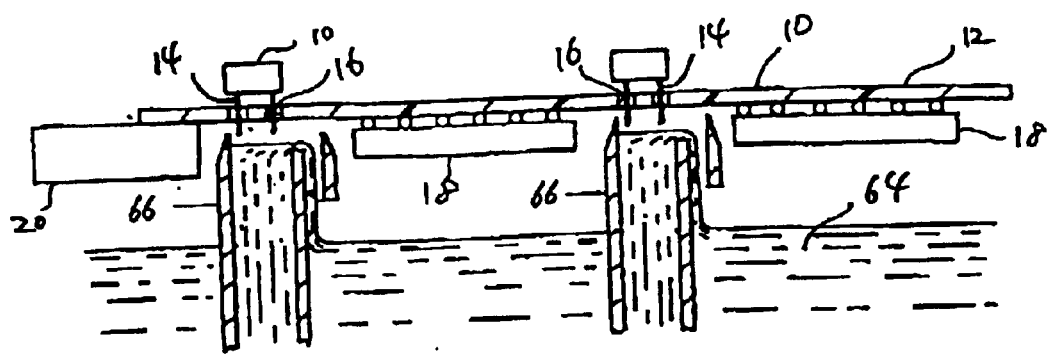
FIG. 7 is a schematic view of the solder wave nozzles wherein the molten solder is maintained at a height slightly below the top of the nozzle to keep the nozzles from cooling down.

Before the printed circuit board 12 is positioned over the solder reservoir 62, the molten solder within the solder wave nozzle 66 is maintained at a height slightly above the top of the inner wall section 70 of the nozzle 66, but slightly (for example, 1.5 mm) below the top of the outer wall section 68 of the nozzle 66. This prevents reduction in the temperature of the solder wave nozzle 66. Then, the printed circuit board 12 is conveyed over the solder reservoir 62 so that the sets of preselected conductor areas 22 on the board 12 are precisely aligned with the respective solder wave nozzles 66, as shown in FIG. 7. At this time, the printed circuit board 12 is stationed at a height of approximately 0.1 to 1.0 mm above the top of the nozzles 66. This spacing should be set so that the molten solder will not escape from between the nozzle 66 and the board 12 due to its surface tension. If excessive space is left between the nozzle 66 and the board 12, the molten solder will flow through the space and could damage adjacent sensitive electronic components or devices. Also, the printed circuit board 12 should not be positioned in contact with the top of the nozzles 66. If so positioned, unwanted solder could be left on the board 12.

Figure 8:
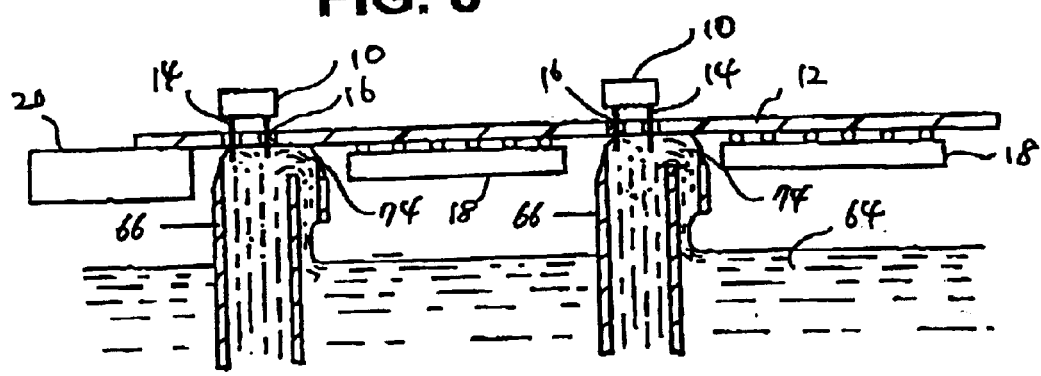
FIG. 8 is a schematic view of the solder wave nozzles wherein the molten solder is pumped up through the nozzles at a relatively low pressure to provide a relatively low wave of solder.

Referring to FIG. 8, with the board 12 positioned over the solder reservoir 62, the molten solder 64 is pumped upwardly in the nozzle 66 at a relatively low pressure to produce a relatively low wave of solder 74, for example, a height of 1 mm above the top of the nozzle 66. The low wave of solder 74 is contacted solely with the preselected conductor areas 22 on the printed circuit board 12 for, for example, approximately one second so as to preheat the conductor areas 22 on the board 12.

Figure 9:
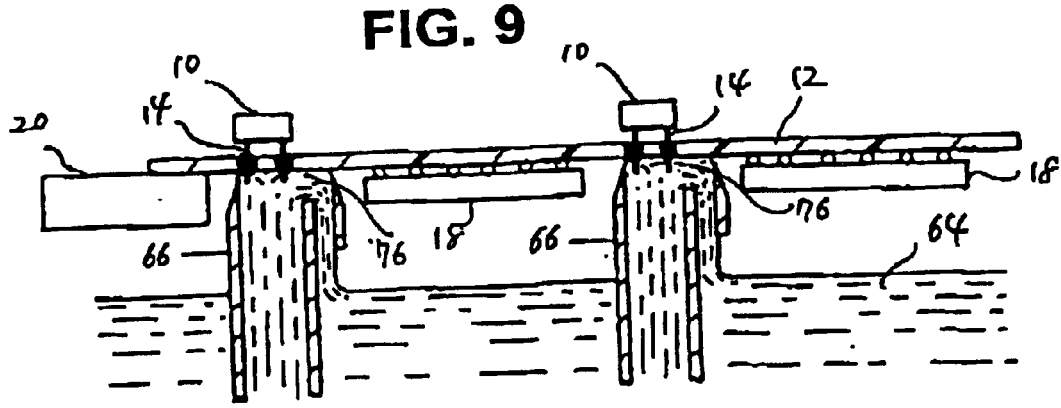
FIG. 9 is a schematic view of the solder wave nozzles wherein the molten solder is pumped up through the nozzles at a relatively high pressure to provide a relatively high wave of solder.

Referring next to FIG. 9, after the preselected conductor areas 22 on the printed circuit board 12 have been preheated, the molten solder 64 is pumped up through the nozzle 66 at a relatively high pressure to produce a relatively high wave of solder 76, for example, a height of 2 mm above the top of the nozzle 66. This high wave of solder 76 is contacted solely with the preselected conductor areas 22 on the board 12 for, for example, approximately two seconds to make appropriate soldered joints. The high solder wave 76 can force the molten solder into the through holes 16 and other hard-to-reach areas on the printed circuit board 12.

Referring to FIG. 10, after application of the solder coating, the solder wave is detached from the underside of the printed circuit board 12. At this time, the height of the molten solder is slowly lowered within the nozzle 66 such that no icicles and bridges are formed in the preselected conductor areas 22 on the board 12. The molten solder is then maintained at a height of, for example, approximately 3 mm below the top of the nozzle 66 for a period of, for example, less than one second. As shown in FIG. 11, the level of the molten solder within the nozzle 66 is thereafter lowered until it becomes equal to the level of the molten solder in the solder reservoir 62.

Finally, the printed circuit board 12 is delivered to a cool down zone (not shown) where the board is cooled.

The present invention has been described with respect to its preferred embodiments, it is to be understood that various modifications and changes may be made without departing from the scope of the invention as defined by the appended claims.

What is claimed is:

1. A method for locally applying solder to a set of preselected conductor areas on a printed circuit board, said method comprising:

aligning said set of preselected conductor areas on the printed circuit board with a corresponding set of fluxers;

applying a flux locally to said set of preselected conductor areas on the printed circuit board;

aligning said set of preselected conductor areas on the printed circuit board with a corresponding set of preheaters;

drying the flux applied on said set of preselected conductor areas on the printed circuit board;

forcing a molten solder within a solder reservoir to flow upwardly through a set of solder wave nozzles so as to clean and preheat said set of solder wave nozzles;

aligning said set of preselected conductor areas on the printed circuit board with said set of solder wave nozzles and maintaining the printed circuit board at a height slightly above said set of solder wave nozzles to the extent that the molten solder is prevented from escaping from between said printed circuit board and said set of solder wave nozzles;

producing a relatively low wave of solder through said set of solder wave nozzles to cause said relatively low wave of solder to contact and preheat said preselected conductor areas on the printed circuit board; and producing a relatively high wave of solder through said set of solder wave nozzles to locally solder said preselected conductor areas on the printed circuit board.

2. The method of claim 1, wherein after said preselected conductor areas on the printed circuit board are locally soldered, the molten solder within said set of solder wave nozzles is lowered at a relatively slow speed, and the molten solder within said set of solder wave nozzles is maintained at a height slightly below a top of said set of solder wave nozzles.

3. The method of claim 2, wherein the molten solder within said set of solder wave nozzles is further lowered until the level of the molten solder within said set of solder wave nozzles is substantially equal to the level of the molten solder within said solder reservoir.

4. The method of claim 1, wherein the printed circuit board is maintained at a height of 0.1 to 1.0 mm above said set of solder wave nozzles before said relatively low wave of solder is produced.

5. The method of claim 1, wherein after said set of solder wave nozzles are cleaned and preheated, the molten solder is maintained within said set of solder wave nozzles at a height slightly below the top of said set of solder wave nozzles.

* * * * *